(12) United States Patent
Polyak et al.

(10) Patent No.: US 10,959,294 B2
(45) Date of Patent: Mar. 23, 2021

(54) HIGH TEMPERATURE HEATER FOR PROCESSING CHAMBER

(71) Applicant: Applied Materials, Inc., Santa Clara, CA (US)

(72) Inventors: Alexander S. Polyak, Palm Coast, FL (US); Joseph Yudovsky, Campbell, CA (US); Garry K. Kwong, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 377 days.

(21) Appl. No.: 15/392,453

(22) Filed: Dec. 28, 2016

(65) Prior Publication Data

US 2017/0196047 A1 Jul. 6, 2017

Related U.S. Application Data

(60) Provisional application No. 62/274,114, filed on Dec. 31, 2015.

(51) Int. Cl.
*H05B 3/18* (2006.01)
*H01L 21/67* (2006.01)
*H01L 21/687* (2006.01)

(52) U.S. Cl.
CPC ......... *H05B 3/18* (2013.01); *H01L 21/67103* (2013.01); *H01L 21/68764* (2013.01); *H01L 21/68771* (2013.01)

(58) Field of Classification Search
None
See application file for complete search history.

(56) References Cited

U.S. PATENT DOCUMENTS

| 3,989,916 A | * | 11/1976 | Amagami | H02M 7/523 219/622 |
| 4,470,369 A | * | 9/1984 | Edgerton | H05B 3/0047 118/723 R |
| 4,931,621 A | | 6/1990 | Goessler | |

(Continued)

FOREIGN PATENT DOCUMENTS

| EP | 1272006 A1 | 1/2003 |
| EP | 1988750 A1 | 11/2008 |

(Continued)

OTHER PUBLICATIONS

PCT International Search Report and Written Opinion in PCT/US2016/068863 dated Apr. 14, 2017, 11 pages.

(Continued)

*Primary Examiner* — Ibrahime A Abraham
*Assistant Examiner* — Elizabeth M Sims
(74) *Attorney, Agent, or Firm* — Servilla Whitney LLC

(57) ABSTRACT

Heater assemblies comprising a cylindrical body with a surface and a central axis including a plurality of heating elements are described. The plurality of heating elements is axially spaced on the surface of the cylindrical body. Each of the heating elements forms an axially spaced heating zone. Each heating element has a spiral shape with an inner end and an outer end defining a length of the heating element. Each coil of the spiral shape is spaced from an adjacent coil by a distance sufficient to prevent arcing between adjacent coils.

9 Claims, 7 Drawing Sheets

(56) References Cited

U.S. PATENT DOCUMENTS

| | | | |
|---|---|---|---|
| 5,498,854 A * | 3/1996 | McWilliams | H05B 3/748 219/449.1 |
| 5,571,320 A | 11/1996 | Grimes et al. | |
| 5,808,280 A * | 9/1998 | Gaspard | H05B 6/065 219/624 |
| 6,369,370 B1 * | 4/2002 | Eskildsen | H05B 6/1254 219/621 |
| 6,423,949 B1 * | 7/2002 | Chen | H01L 21/67103 118/725 |
| 6,740,853 B1 * | 5/2004 | Johnson | C23C 16/4586 118/620 |
| 7,521,654 B2 | 4/2009 | Heinrich et al. | |
| 2008/0173638 A1 * | 7/2008 | Mariner | H05B 3/145 219/553 |
| 2009/0095733 A1 * | 4/2009 | Komatsu | H01L 21/67103 219/521 |
| 2009/0266808 A1 | 10/2009 | Shibata et al. | |
| 2011/0073039 A1 * | 3/2011 | Colvin | C23C 16/45504 118/725 |
| 2012/0145701 A1 * | 6/2012 | Colvin | H05B 3/12 219/553 |
| 2012/0261405 A1 * | 10/2012 | Kurose | H05B 6/062 219/620 |
| 2013/0199405 A1 | 8/2013 | Rangarajan et al. | |
| 2013/0284721 A1 | 10/2013 | Yang et al. | |
| 2014/0196505 A1 | 7/2014 | Enomoto et al. | |
| 2015/0048076 A1 * | 2/2015 | Mohr | H05B 1/0216 219/448.11 |
| 2016/0021702 A1 * | 1/2016 | Jang | H05B 1/0233 134/18 |

FOREIGN PATENT DOCUMENTS

| | | |
|---|---|---|
| JP | H0982786 A | 3/1997 |
| JP | 2002231420 A | 8/2002 |
| JP | 2004022243 A | 1/2004 |
| JP | 2008108703 A | 5/2008 |
| WO | 2013002028 A1 | 1/2013 |

OTHER PUBLICATIONS

PCT International Preliminary Report on Patentability in PCT/US2016/068863 dated Jul. 12, 2018, 8 pages.

* cited by examiner

HIGH TEMPERATURE HEATER FOR PROCESSING CHAMBER

CROSS-REFERENCE TO RELATED APPLICATIONS

This application claims priority to U.S. Provisional Application No. 62/274,114, filed Dec. 31, 2015, the entire disclosure of which is hereby incorporated by reference herein.

TECHNICAL FIELD

The present disclosure relates generally to heating apparatus for processing chamber. In particular, the disclosure relates to high temperature heaters for batch processing chambers.

BACKGROUND

Semiconductor device formation is commonly conducted in substrate processing systems or platforms containing multiple chambers, which may also be referred to as cluster tools. In some instances, the purpose of a multi-chamber processing platform or cluster tool is to perform two or more processes on a substrate sequentially in a controlled environment. In other instances, however, a multiple chamber processing platform may only perform a single processing step on substrates. The additional chambers can be employed to maximize the rate at which substrates are processed. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

Temperature uniformity may be an important consideration in CVD or ALD process. Resistive heaters are widely employed in the heating systems of CVD and ALD systems. Even slight variations in temperature uniformity across a wafer, on the order of just a few degrees Celsius, can adversely affect a CVD or ALD process. The size of the batch processing chambers further increases the complexity and requirements of the heating sources. Accordingly, there is a need in the art for improved heaters for batch processing chambers

SUMMARY

One or more embodiments of the disclosure are directed to heater assemblies comprising a cylindrical body with a surface and a central axis and a plurality of heating elements. The plurality of heating elements is axially spaced on the surface of the cylindrical body. Each of the plurality of heating elements forms and axially spaced heating zone. Each heating element has a spiral shape with an inner end and an outer end defining a length of the heating element. Each coil of the spiral shape is spaced from an adjacent coil by a distance sufficient to prevent arcing between adjacent coils.

Additional embodiments of the disclosure are directed to susceptor assemblies. The susceptor assemblies comprise a heater assembly with a cylindrical body with a surface and a central axis. A plurality of heating elements is axially spaced on the surface of the cylindrical body. Each of the plurality of heating elements forms and axially spaced heating zone. Each heating element has a spiral shape with an inner end and an outer end defining a length of the heating element. Each coil of the spiral shape is spaced from an adjacent coil by a distance sufficient to prevent arcing between adjacent coils.

Further embodiments of the disclosure are directed to processing chambers comprising a gas distribution assembly, a susceptor assembly and a heater assembly. The heater assembly comprises a cylindrical body with a surface and a central axis, and a plurality of heating elements. The plurality of heating elements is axially spaced on the surface of the cylindrical body. Each of the plurality of heating elements forms and axially spaced heating zone. Each heating element has a spiral shape with an inner end and an outer end defining a length of the heating element. Each coil of the spiral shape is spaced from an adjacent coil by a distance sufficient to prevent arcing between adjacent coils

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Figure 1:
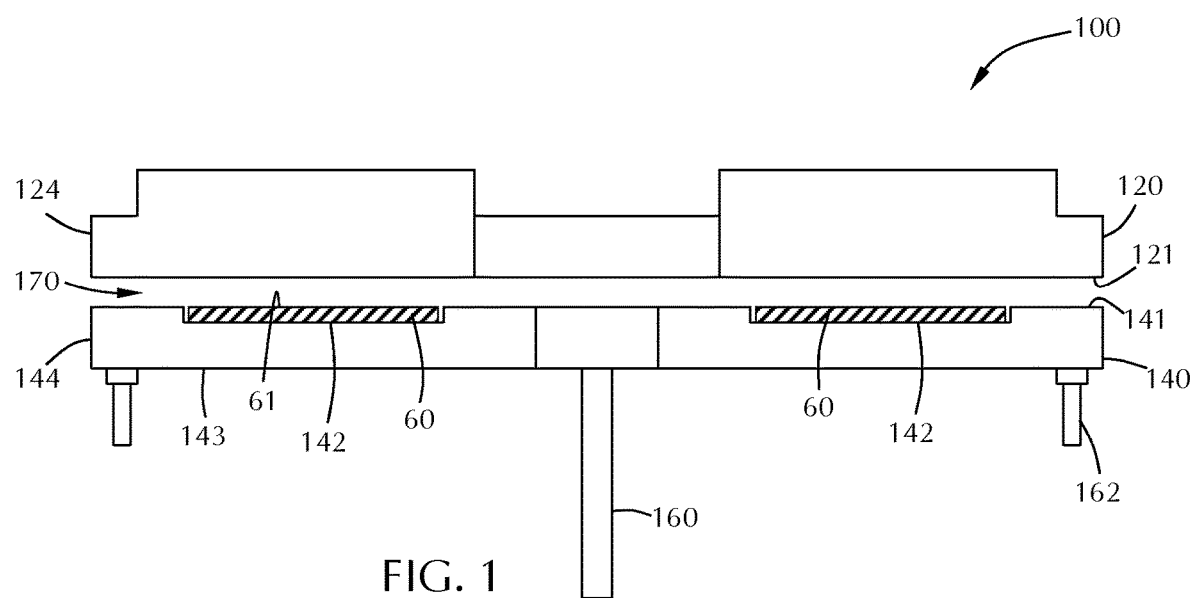
FIG. 1 shows a cross-sectional view of a batch processing chamber in accordance with one or more embodiment of the disclosure.

FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer peripheral edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 2:
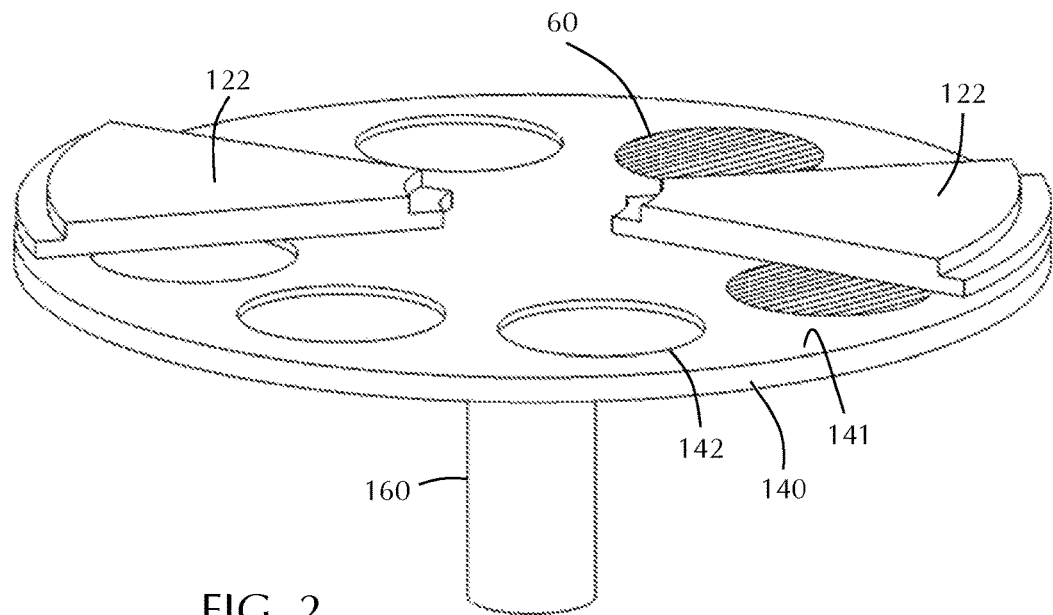
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
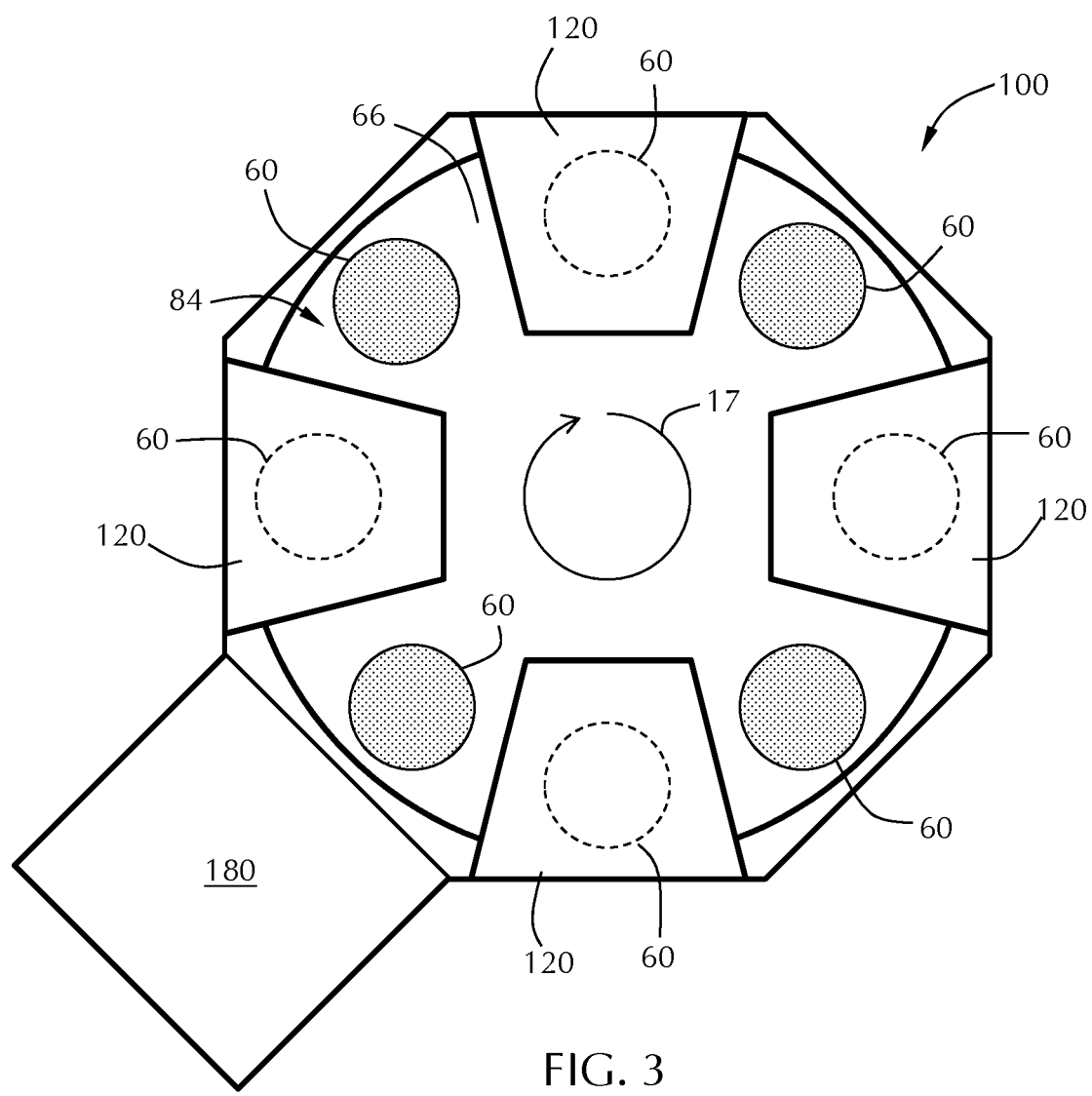
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the injector assemblies 30. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one. In an exemplary embodiment, the gas distribution assembly 120 includes eight process regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
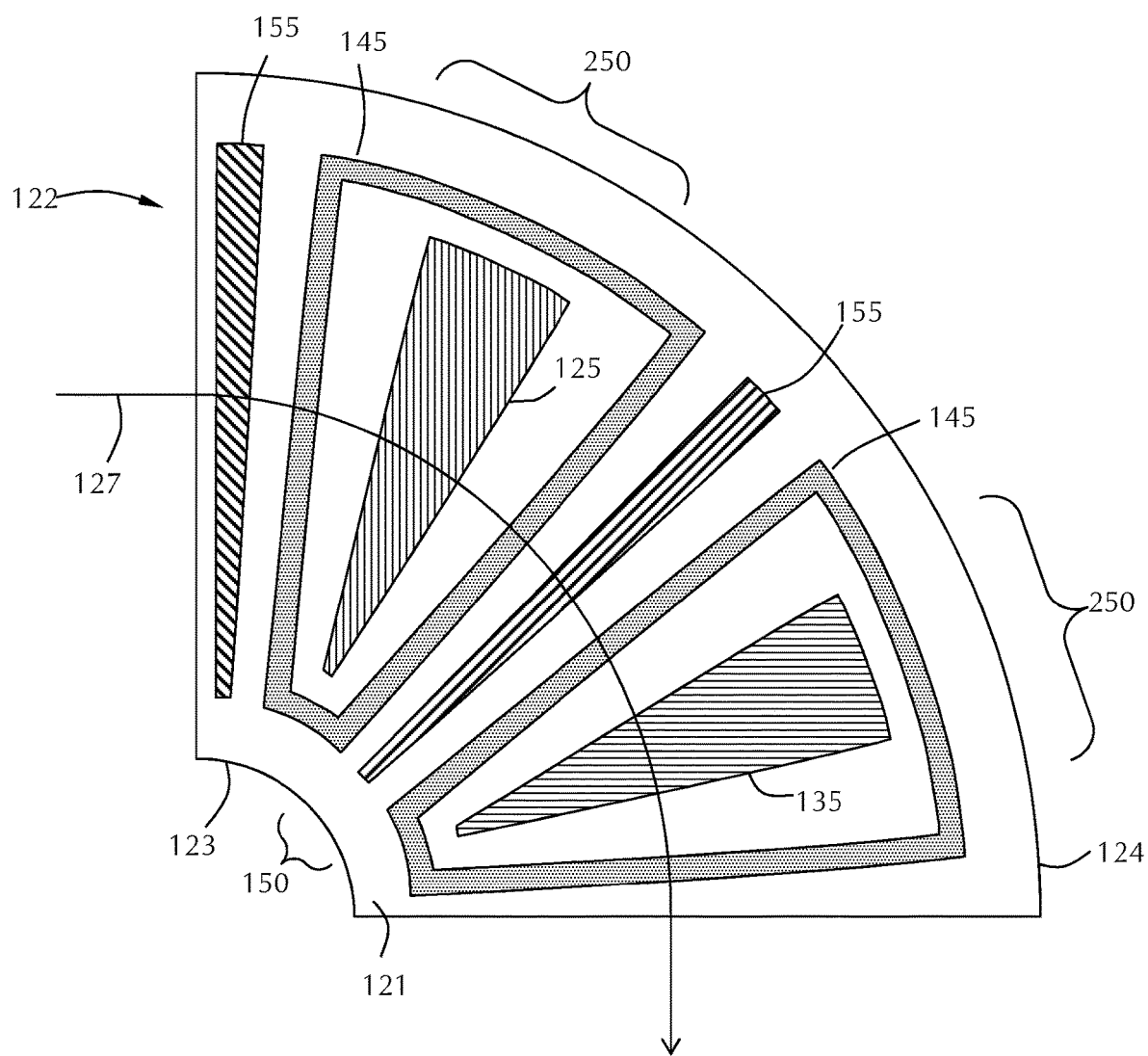
FIG. 4 shows a schematic view of a portion of a wedge shaped gas distribution assembly for use in a batch processing chamber in accordance with one or more embodiment of the disclosure.
Figure 5:
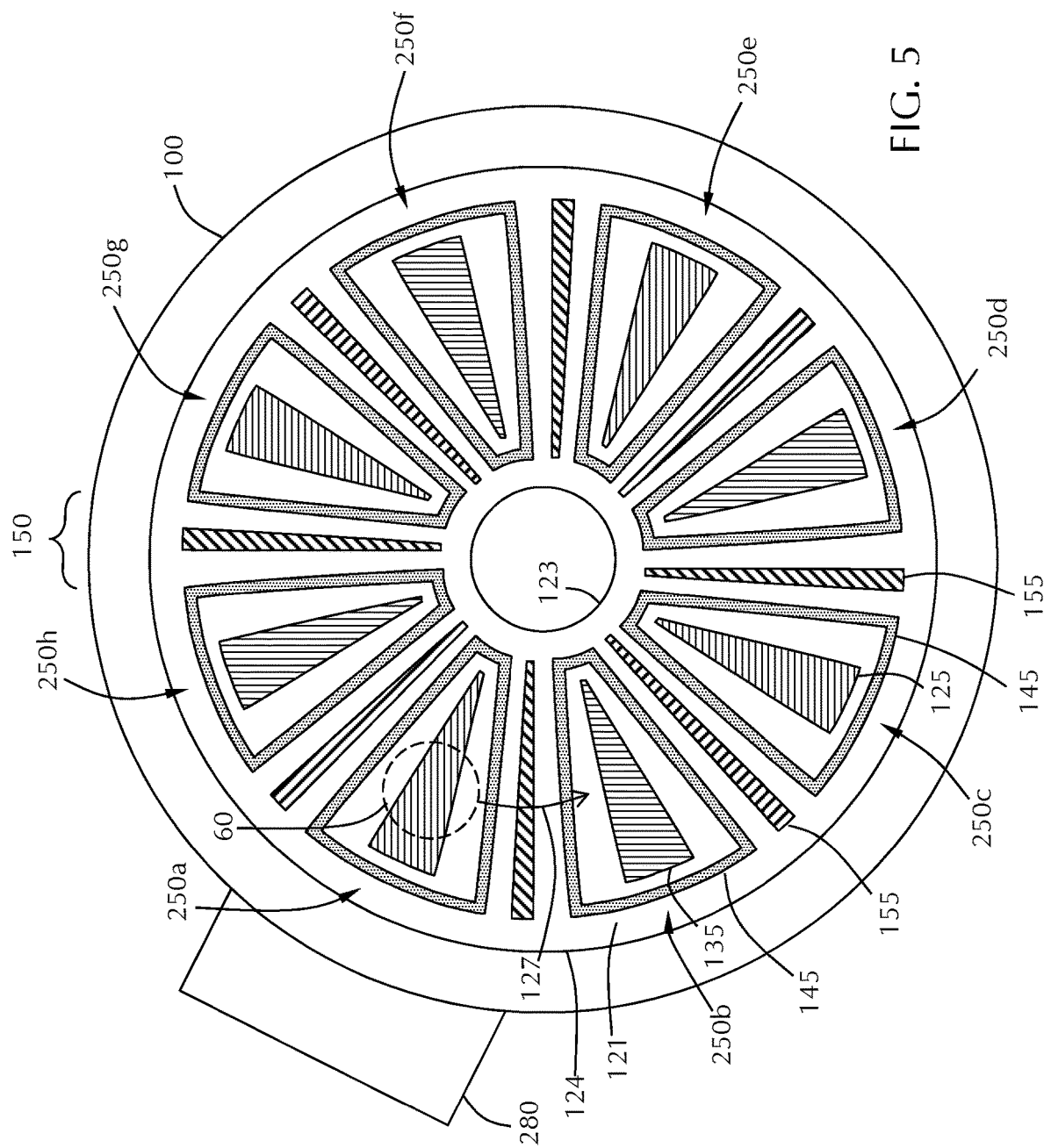
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 145 in a front surface 121 of the gas distribution assembly 220. The plurality of elongate gas ports 125, 135, 145, 155 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first reactive gas and the second reactive gas to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of process regions 250. The process regions are roughly defined around the individual gas ports 125, 135 with the gas curtain 150 between 250. The embodiment shown in FIG. 5 makes up eight separate process regions 250 with eight separate gas curtains 150 between. A processing chamber can have at least two process regions. In some embodiments, there are at least three, four, five, six, seven, eight, nine, 10, 11 or 12 process regions.

During processing a substrate may be exposed to more than one process region 250 at any given time. However, the portions that are exposed to the different process regions will have a gas curtain separating the two. For example, if the leading edge of a substrate enters a process region including the second gas port 135, a middle portion of the substrate will be under a gas curtain 150 and the trailing edge of the substrate will be in a process region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution plate 120. The substrate 60 is loaded via the factory interface 280 into the processing chamber 100 onto a substrate support or susceptor assembly (see FIG. 3). The substrate 60 can be shown positioned within a process region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first process region 250a through the eighth process region 250h, including all process regions between.

Embodiments of the disclosure are directed to processing methods comprising a processing chamber 100 with a plurality of process regions 250a-250h with each process region separated from an adjacent region by a gas curtain 150. For example, the processing chamber shown in FIG. 5. The number of gas curtains and process regions within the processing chamber can be any suitable number depending on the arrangement of gas flows. The embodiment shown in FIG. 5 has eight gas curtains 150 and eight process regions 250a-250h. The number of gas curtains is generally equal to or greater than the number of process regions.

A plurality of substrates 60 are positioned on a substrate support, for example, the susceptor assembly 140 shown FIGS. 1 and 2. The plurality of substrates 60 are rotated around the process regions for processing. Generally, the gas curtains 150 are engaged (gas flowing and vacuum on) throughout processing including periods when no reactive gas is flowing into the chamber.

A first reactive gas A is flowed into one or more of the process regions 250 while an inert gas is flowed into any process region 250 which does not have a first reactive gas A flowing into it. For example if the first reactive gas is flowing into process regions 250b through process region 250h, an inert gas would be flowing into process region 250a. The inert gas can be flowed through the first reactive gas port 125 or the second gas port 135.

The inert gas flow within the process regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the process regions easier by decreasing the differences in pressure between adjacent regions.

The susceptor assembly body can include tubular heaters. Tubular heaters provide sufficient heat and control to operate at temperatures up to 500° C. to 600° C. However, these types of heaters cannot support higher temperatures.

Some embodiments of the disclosure are directed to high temperature heating elements. Some embodiments advantageously provide elements with support structures and reflectors below the susceptor. Some embodiments including a support structure are advantageously equipped with a carriage which may be supported by a beam structure. Heater material undergoes substantial thermal deformation during heat-up and cool-down. The carriages of some embodiments advantageously change position to accommodate heater displacement and maintain spacing between heater coils to avoid electrical short circuit.

Some embodiments provide heaters designed in a spiral form that allows for predictable and reduced delta potential between adjacent coils. Spacing between the coils advantageously designed so that little or no arcing between the heater coils occurs throughout full range of operating pressures.

Figure 6:
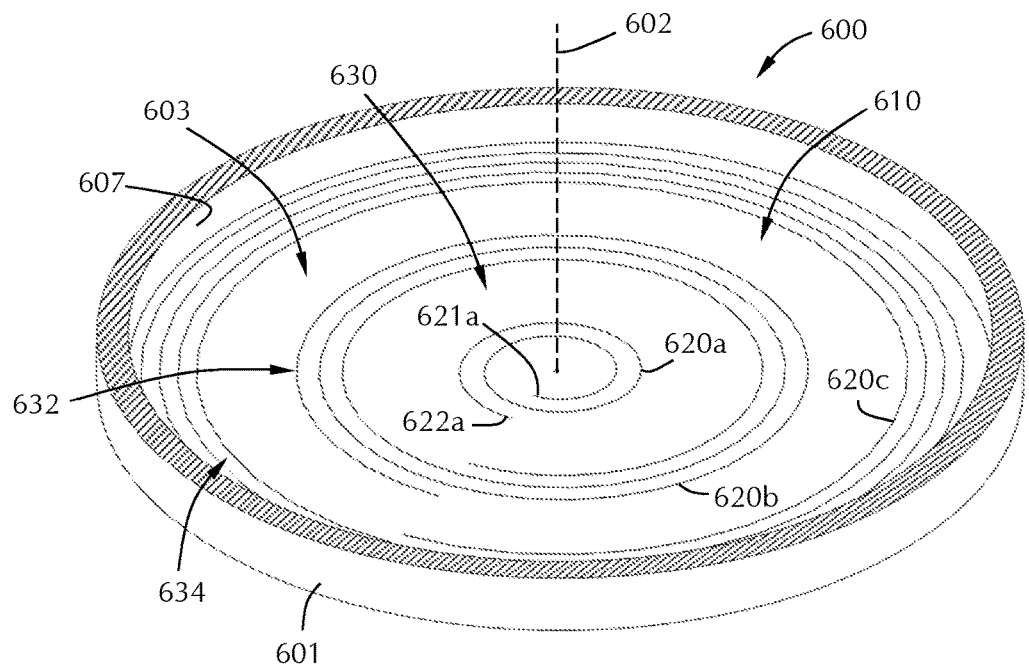
FIG. 6 shows a heater assembly in accordance with one or more embodiment of the disclosure.

FIG. 6 shows a heater assembly 600 in accordance with one or more embodiment of the disclosure. The heater assembly 600 has a generally cylindrical body 601 with a central axis 602. The heater assembly 600 shown has a surface 603 surrounded by a sidewall 607. The region within the sidewall 607 is referred to as the interior 610 of the heater assembly 600.

The heater assembly 600 of some embodiments includes a plurality of axially spaced heating elements 620a, 620b, 620c within the interior 610. The plurality of heating elements form axially spaced heating zones 630, 632, 634. The embodiment shown in FIG. 6 includes three heating elements 620 forming three heating zones 630, 632, 634. The heating zones are defined by an inner heating element 620a, a middle heating element 620b and an outer heating element 620c.

The inner heating element 620a is positioned near the central axis 602 of the heater assembly 600. The inner heating element 620a is shown as a spiral shape which surrounds the central axis 602. The inner heating element 620a shown makes two cycles around the central axis 602. The inner heating element 620a extends from the inner end 621a to the outer end 622a. The distance between the inner end 621a and the outer end 622a along the heating element defines a length of the heating element. Each coil of the spiral shape is spaced from an adjacent coil by a distance sufficient to prevent arcing between adjacent coils.

The inner heating element 620a has a first number of coils. The number of cycles or coils that the inner heating element 620a makes around the central axis 602 can vary from less than a complete cycle to any number of cycles depending on, for example, the size of the heater assembly 600, the spacing between the coils, the power to be applied to the element and the material that makes up the heating element. A larger heater assembly 600 may have an inner heating element 620a with more cycles than a smaller heater assembly 600. In some embodiments, the inner heating element 620a comprises in the range of about 0.5 to about 15 cycles, or in the range of about 1 to about 10 cycles, or in the range of about to about 6 cycles around the central axis 602. In some embodiments, the inner heating element 620a cycles around the central axis 602 less than or equal to about 15, 14, 13, 12, 11, 10, 9, 8, 7, 6, 5, 4 or 3 times. In some embodiments, the inner heating element 620a comprises at least about 3 coils.

The inner heating element 620a may extend a distance from the central axis 602 up to about 50% of the space between the central axis 602 and the sidewall 607 of the heater assembly 600. In some embodiments, the inner heating element 620a forms an inner heating zone 630 that extends from about the central axis 602 to a distance of less than or equal to about 40%, 35%, 33%, 30%, 25% or 20% of the distance between the central axis 602 to the inner wall 607 of the heater assembly 600. The distance between the central axis 602 and the sidewall 607 is generally large enough to provide heat for a susceptor with a diameter greater than 500 mm. In some embodiments, the distance between the central axis 602 and the sidewall 607 is greater than about 300 mm, 400 mm, 500 mm, 600 mm, 700 mm, 800 mm or 900 mm.

The spacing between the individual coils of the inner heating element 620a can vary. In some embodiments, the coils are spaced so that the density of the electromagnetic field between adjacent points of each ring is low enough to prevent electrical arcing between the rings. In some embodiments, the coils of the inner heating element 620a are spaced in the range of about 1 mm to about 10 mm, or in the range of about 2 mm to about 9 mm, or in the range of about 3 mm to about 8 mm, or in the range of about 4 mm to about 7 mm, or about 5 mm.

The length of the inner heating element 620a from the inner end 621a to the outer end 622a can vary depending on, for example, the size of the heater assembly 600, the size of the inner heating zone 630 and the spacing between coils. In some embodiments, the inner heating element 620a has a length in the range of about 1 m to about 5 m, or in the range of about 2 m to about 4 m or about 3 m.

The middle heating element 620b is positioned further from the central axis 602 of the heater assembly 600 than the inner heating element 620a. Use of the term "middle" should not be taken as limiting the scope of the disclosure to three heating elements. The terms "inner", "middle" and "outer" used to describe the heating elements in the Figures is used to merely denote the different elements shown and is not limited to three heating elements. Those skilled in the art will understand that other heating elements and heating zones can be included.

The middle heating element 620b is shown as a spiral shape which surrounds the central axis 602 and the inner heating element 620a. The space between the inner heating element 620a and the middle heating element 620b can vary from no space between the heating elements to about 1 meter, measured along the radius of the heating assembly. In some embodiments, the middle heating element 620b is spaced from the inner heating element 620a by a distance in the range of about 10 mm to about 1 m, or in the range of about 20 mm to about 500 mm, or in the range of about 30 mm to about 400 mm, or in the range of about 40 mm to about 300 mm, or in the range of about 50 mm to about 200 mm, or in the range of about 60 mm to about 150 mm, or in the range of about 70 mm to about 100 mm.

The middle heating element 620b shown makes two cycles around the central axis 602. The middle heating element 620b extends from the inner end 621b to the outer end 622b. The distance between the inner end 621b and the outer end 622b along the heating element defines a length of the middle heating element 620b. Each coil of the spiral shape is spaced from an adjacent coil by a distance sufficient to prevent arcing between adjacent coils.

The middle heating element 620b comprises a second number of coils. The second number of coils can be the same or different than the first number of coils of the inner heating element 620a. The number of cycles or coils that the middle heating element 620b makes around the central axis 602 can vary from less than a complete cycle to any number of cycles depending on, for example, the size of the heater assembly 600, the spacing between the coils, the power to be applied to the element and the material that makes up the heating element. A larger heater assembly 600 may have a middle heating element 620b with more cycles than a smaller heater assembly 600. In some embodiments, the middle heating element 620b comprises in the range of about 0.5 to about 15 cycles, or in the range of about 1 to about 10 cycles, or in the range of about 2 to about 6 cycles around the central axis 602. In some embodiments, the middle heating element 620b cycles around the central axis 602 less than or equal to about 15, 14, 13, 12, 11, 10, 9, 8, 7, 6, 5, 4 or 3 times. In some embodiments, the second number of coils is greater than or equal to about 3.

The middle heating element 620b may extend a distance from the central axis 602 in the range of about 25% to about 75% of the space between the central axis 602 and the sidewall 607 of the heater assembly 600. In some embodiments, the middle heating element 620b forms a middle heating zone 632 that extends from a minimum distance from the central axis 602 greater than or equal to about 20%, 25%, 30%, 35% or 40% of the distance between the central axis 602 to the inner wall 607 of the heater assembly 600. In some embodiments, the middle heating element 620b forms a middle heating zone 632 that extends to a maximum distance from the central axis 602 greater than or equal to about 60%, 65%, 70%, 75% or 80% of the distance between the central axis 602 to the inner wall 607 of the heater assembly 600.

The spacing between the individual coils of the middle heating element 620b can vary. In some embodiments, the coils are spaced so that the density of the electromagnetic field between adjacent points of each ring is low enough to prevent electrical arcing between the rings. In some embodiments, the coils of the middle heating element 620b are spaced in the range of about 1 mm to about 10 mm, or in the range of about 2 mm to about 9 mm, or in the range of about 3 mm to about 8 mm, or in the range of about 4 mm to about 7 mm, or about 5 mm.

The length of the middle heating element 620b from the inner end 621b to the outer end 622b can vary depending on, for example, the size of the heater assembly 600, the size of the middle heating zone 632 and the spacing between coils. In some embodiments, the middle heating element 620b has a length in the range of about 1 m to about 10 m, or in the range of about 2 m to about 9 m or in the range of about 3 m to about 8 m, or in the range of about 4 m to about 7 m.

The outer heating element 620c is positioned further from the central axis 602 of the heater assembly 600 than the inner heating element 620a and the middle heating element 620c. Use of the term "outer" should not be taken as limiting the scope of the disclosure to two or three heating elements. The terms "inner", "middle" and "outer" used to describe the heating elements in the Figures are merely used to denote the different elements shown.

The outer heating element 620c is shown as a spiral shape which surrounds the central axis 602, the inner heating element 620a and the middle heating element 620c. The space between the middle heating element 620b and the outer heating element 620c can vary from no space between the heating elements to about 1 meter, measured along the radius of the heating assembly. In some embodiments, the outer heating element 620c is spaced from the middle heating element 620b by a distance in the range of about 10 mm to about 1 m, or in the range of about 20 mm to about 500 mm, or in the range of about 30 mm to about 400 mm, or in the range of about 40 mm to about 300 mm, or in the range of about 50 mm to about 200 mm, or in the range of about 60 mm to about 150 mm, or in the range of about 70 mm to about 100 mm.

The outer heating element 620c shown makes two cycles around the central axis 602. The outer heating element 620c extends from the inner end 621c to the outer end 622c. The distance between the inner end 621c and the outer end 622c along the heating element defines a length of the outer heating element 620c. Each coil of the spiral shape is spaced from an adjacent coil by a distance sufficient to prevent arcing between adjacent coils.

The outer heating element 620c comprises a third number of coils. The third number of coils can be the same as or different from the first number of coils of the inner heating element 620a and/or the second number of coils of the middle heating element 620b. The number of cycles or coils that the outer heating element 620c makes around the central axis 602 can vary from less than a complete cycle to any number of cycles depending on, for example, the size of the heater assembly 600, the spacing between the coils, the power to be applied to the element and the material that makes up the heating element. A larger heater assembly 600 may have an outer heating element 620c with more cycles than a smaller heater assembly 600. In some embodiments, the outer heating element 620c comprises in the range of about 0.5 to about 20 cycles, or in the range of about 1 to about 15 cycles, or in the range of about 2 to about 10 cycles, or in the range of about 4 to about 9 cycles around the central axis 602. In some embodiments, the outer heating element 620c cycles around the central axis 602 less than or equal to about 20, 19, 18, 17, 16, 15, 14, 13, 12, 11, 10, 9, 8, 7, 6, 5, 4 or 3 times. In some embodiments, the third number of coils is greater than or equal to about 3. In some embodiments, the third number of coils is greater than or equal to the first number of coils and/or the second number of coils.

The outer heating element 620c may extend a distance from the central axis 602 in the range of about 50% to about 100% of the space between the central axis 602 and the sidewall 607 of the heater assembly 600, where 100% is at the sidewall 607. In some embodiments, the outer heating element 620c forms an outer heating zone 634 that extends from a minimum distance from the central axis 602 greater than or equal to about 50%, 55%, 60%, 65%, 70%, 75%, 80% or 85% of the distance between the central axis 602 to the inner wall 607 of the heater assembly 600, where 100% is at the sidewall 607. In some embodiments, the outer heating element 620c forms an outer heating zone 634 that extends to a maximum distance from the central axis 602 less than or equal to about 100%, 95%, 90%, 85% or 80% of the distance between the central axis 602 to the inner wall 607 of the heater assembly 600.

The spacing between the individual coils of the outer heating element 620c can vary. In some embodiments, the coils are spaced so that the density of the electromagnetic field between adjacent points of each ring is low enough to prevent electrical arcing between the rings. In some embodiments, the coils of the outer heating element 620c are spaced in the range of about 1 mm to about 10 mm, or in the range of about 2 mm to about 9 mm, or in the range of about 3 mm to about 8 mm, or in the range of about 4 mm to about 7 mm, or about 5 mm.

The length of the outer heating element 620c from the inner end 621c to the outer end 622c can vary depending on, for example, the size of the heater assembly 600, the size of the outer heating zone 634 and the spacing between coils. In some embodiments, the outer heating element 620c has a length in the range of about 1 m to about 15 m, or in the range of about 2 m to about 14 m or in the range of about 3 m to about 13 m, or in the range of about 4 m to about 12 m.

In one or more embodiments, As shown in FIG. 6, the plurality of heating elements are radially spaced on the surface of the cylindrical body and form an inner heating zone 630 spaced a first distance from the central axis 602. A middle heating zone 632 is spaced a second distance from the central axis 602 that is greater than the first distance. An outer heating zone 634 is spaced a third distance from the central axis 602 that is greater than the second distance. The spacing between the heating zones and the size of the heating zones will depend on, for example, the materials used for construction of the heating elements, the heater housing and the susceptor assembly the heater is used with.

The heating elements can be made from any suitable materials including, but not limited to, graphite. In some embodiments, the inner heating element 620a, the middle heating element 620b and outer heating element 620c comprise graphite. The graphite used for the various heating elements can be the same grade or different grades. In some embodiments, the graphite used for the outer heating element 620c has a higher coefficient of thermal expansion (CTE) than the graphite used for the inner heating element 620a and/or the middle heating element 620b. Graphite with a higher CTE will have a greater amount of expansion with increased temperature than graphite with a lower CTE. The higher expansion could result in graphite scraping off of the heating element. In some embodiments, the graphite used for the various heating elements has the same resistivity and/or grain size. In some embodiments, the graphite used for the inner heating element has a higher resistivity than the graphite used for the outer heating element. In some embodiments, the graphite used for the longest heating element has a lower resistivity than the graphite used for the shortest heating element.

Figure 7:
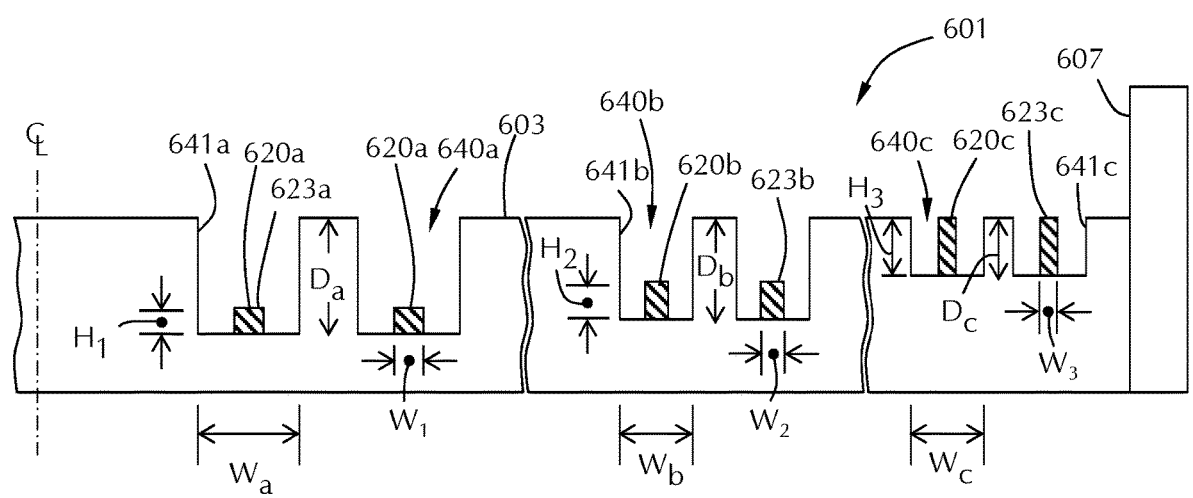
FIG. 7 shows a partial cross-sectional view of a heater assembly in accordance with one or more embodiment of the disclosure.

In some embodiments, one or more of the heating elements are positioned within channels formed in the surface 603 of the cylindrical body 601 of the heater assembly 600. FIG. 7 shows an embodiment of the disclosure in which the inner heating element 620a is positioned within an inner channel 640a in the surface 603 of the cylindrical body 601. The inner channel 640a has a width $W_a$ and a depth $D_a$. In some embodiments, the inner channel 640a has a shape that conforms to the shape of the inner heating element 620a so that the length of the inner heating element 620a is within the inner channel 640a. FIG. 7 also illustrates an embodiment of the disclosure in which each of the plurality of resistive heating elements form axially spaced heating zones within axially spaced channels. As illustrated, the inner heating element 620a in the inner channel 640a is lower than the middle heating element 620b in the middle channel 640b. The middle heating element 620b in the middle channel 640b is lower than the outer heating element 620c in the outer channel 640c. FIG. 7 illustrates an embodiment in which the resistive heating elements are both axially and radially spaced. The axial spacing is illustrated by the an inner heating element 620a at a depth $D_a$, the middle heating element 620b at a depth $D_b$ and the outer heating element 620c at a depth $D_c$, where the depth $D_c$ is less than the depth $D_b$, and the depth $D_b$ is less than the depth $D_a$. In one or more embodiments the depths of the heating elements are axially spaced such that the top surface 623a of the inner heating element 620a is below the top surface 623b of the middle heating element 620b, and the top surface 623b of the middle heating element 620b is below the top surface 623c of the outer heating element 620c. FIG. 7 also shows an embodiment in which the inner heating element 620a has a first width $W_1$ and a first height $H_1$, the middle heating element 620b has a second width $W_2$ and a second height $H_2$, and the outer heating element 620c has a third width $W_3$ and a third height $H_3$, the first width $W_1$ being greater than the second width $W_2$, the second width $W_2$ being greater than the third width $W_3$, the first height $H_1$ being less than the second height $H_2$, and the second height $H_2$ being less than the third height $H_3$.

The width $W_a$ of the inner channel 640a can be the same as the width $W_1$ of the inner heating element 620a. In some embodiments, the width $W_a$ of the inner channel 640a is wider than the width $W_1$ of the inner heating element 620a to allow for expansion and/or contraction of the inner heating element 620a within the inner channel 640a. In some embodiments, the width $W_1$ of the inner heating element 620a is in the range of about 10% to about 90% of the width $W_a$ of the inner channel 640a. In various embodiments, the width $W_1$ of the inner heating element 620a is in the range of about 20% to about 80%, or about 30% to about 70%, or about 40% to about 60% of the width $W_a$ of the inner channel 640a.

The depth $D_a$ of the inner channel 640a can be the same as the height $H_1$ of the inner heating element 620a. In some embodiments, the inner channel 640a has a depth $D_a$ greater than the height $H_1$ of the inner heating element 620a so that walls 641a of the inner channel 640a extend above a top 623a of the inner heating element 620a. In some embodiments, the height $H_1$ of the inner heating element 620a is in the range of about 10% to about 50% of the depth $D_a$ of the inner channel 640a. In various embodiments, the height $H_1$ of the inner heating element 620a is greater than about 10% of the depth $D_a$ of the inner channel 640a and is less than or equal to about 90%, 80%, 70%, 60%, 50%, 40% or 30% of the depth $D_a$ of the inner channel 640a.

In some embodiments, the middle heating element 620b is positioned within a middle channel 640b in the surface 603 of the cylindrical body 601. The middle channel 640b has a width $W_b$ and a depth $D_b$. In some embodiments, the middle channel 640b has a shape that conforms to the shape of the middle heating element 620b so that the length of the middle heating element 620b is within the middle channel 640b.

The width $W_b$ of the middle channel 640b can be the same as the width $W_2$ of the middle heating element 620b. In some embodiments, the width $W_b$ of the middle channel 640b is wider than the width $W_2$ of the middle heating element 620b to allow for expansion and/or contraction of the middle heating element 620b within the middle channel 640b. In some embodiments, the width $W_2$ of the middle heating element 620b is in the range of about 10% to about 90% of the width $W_b$ of the middle channel 640b. In various embodiments, the width $W_2$ of the middle heating element 620b is in the range of about 20% to about 80%, or about 30% to about 70%, or about 40% to about 60% of the width $W_b$ of the middle channel 640b.

The depth $D_b$ of the middle channel 640b can be the same as the height $H_2$ of the middle heating element 620b. In some embodiments, the middle channel 640b has a depth $D_b$ greater than the height $H_2$ of the middle heating element 620b so that walls 641b of the middle channel 640b extend above a top 623b of the middle heating element 620b. In some embodiments, the height $H_2$ of the middle heating element 620b is in the range of about 10% to about 50% of the depth $D_b$ of the middle channel 640b. In various embodiments, the height $H_2$ of the middle heating element 620b is greater than about 10% of the depth $D_b$ of the middle channel 640b and is less than or equal to about 100% 90%, 80%, 70%, 60%, 50%, 40% or 30% of the depth $D_b$ of the middle channel 640b.

In some embodiments, the depth $D_b$ of the middle channel 640b is less than or equal to about the depth $D_a$ of the inner channel 640a. In one or more embodiments, the depth $D_b$ of the middle channel 640b is less than or equal to about the depth $D_a$ of the inner channel 640a and the height $H_1$ of the inner heating element 620a is about the same as the height $H_2$ of the middle heating element 620b.

In some embodiments, the outer heating element 620c is positioned within an outer channel 640c in the surface 603 of the cylindrical body 601. The outer channel 640c has a width $W_c$ and a depth $D_c$. In some embodiments, the outer channel 640c has a shape that conforms to the shape of the outer heating element 620c so that the length of the outer heating element 620c is within the outer channel 640c.

The width $W_c$ of the outer channel 640c can be the same as the width $W_3$ of the outer heating element 620c. In some embodiments, the width $W_c$ of the outer channel 640c is wider than the width $W_3$ of the outer heating element 620c to allow for expansion and/or contraction of the outer heating element 620c within the outer channel 640c. In some embodiments, the width $W_3$ of the outer heating element 620c is in the range of about 10% to about 90% of the width $W_c$ of the outer channel 640c. In various embodiments, the width $W_3$ of the outer heating element 620c is in the range of about 20% to about 80%, or about 30% to about 70%, or about 40% to about 60% of the width $W_c$ of the outer channel 640c.

The depth $D_c$ of the outer channel 640c can be the same as the height $H_3$ of the outer heating element 620c. In some embodiments, the outer channel 640c has a depth $D_c$ greater than the height $H_3$ of the outer heating element 620c so that walls 641c of the outer channel 640c extend above a top 623c of the outer heating element 620c. In some embodiments, the height $H_c$ of the outer heating element 620c is in the range of about 50% to about 100% of the depth $D_c$ of the outer channel 640c. In various embodiments, the height $H_3$ of the outer heating element 620c is greater than about 70% of the depth $D_c$ of the outer channel 640c and is less than or equal to about 110% 105%, 100%, 95% or 90% of the depth $D_c$ of the outer channel 640c.

In some embodiments, the depth $D_c$ of the outer channel 640c is less than or equal to about the depth $D_b$ of the middle channel 640b and the inner channel 640a. In one or more embodiments, the depth $D_c$ of the outer channel 640c is less than or equal to about the depth $D_b$ of the middle channel 640b and the height $H_2$ of the middle heating element 620b is about the same as the height $H_3$ of the outer heating element 620c. In some embodiments, the outer channel 640c has a depth $D_c$ that is substantially the same as a height $H_3$ of the outer heating element 620c so that a top 623c of the outer heating element 620c is substantially even with the surface 603 of the cylindrical body 601. As used in this regard, the term "substantially even with" means that the top of the heating element is within about 0.1 mm, 0.2 mm, 0.3 mm, 0.4 mm or 0.5 mm of the surface of the cylindrical body.

The walls 641 of the channels 640 can be substantially perpendicular to the surface 603 of the cylindrical body 601.

Figure 8:
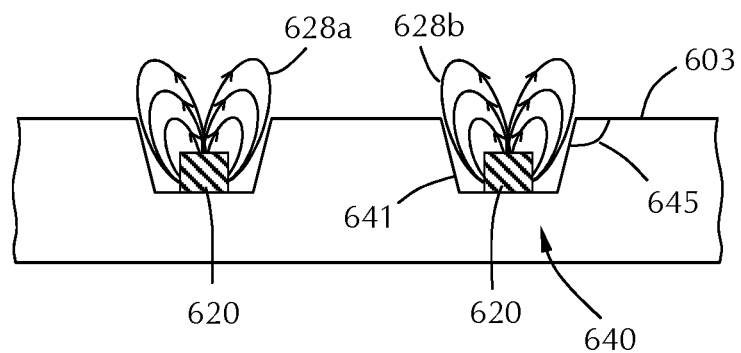
FIG. 8 shows a partial cross-sectional view of a heater assembly in accordance with one or more embodiment of the disclosure.

As used in this regard, the term "substantially perpendicular" means that the angle made by the surface 603 and the wall 641 is in the range of about 85° to about 95°. Referring to FIG. 8, in some embodiments, the walls 641 of the channels 640 are tilted to form an angle 645 with the surface 603 greater than about 95°. In some embodiments, the angle 645 is greater than about 100°, 105°, 110°, 115° or 120°. In one or more embodiments, the angle 645 is sufficiently low to prevent significant overlap of the electrical field 628a and 628b generated by the heating element 620 to minimize the chance of arcing between the adjacent coils or between adjacent heating elements. In some embodiments, the walls of at least one of the heating elements are substantially perpendicular to the surface 603 and the walls of at least one of the heating elements forms an angle 645 greater than or equal to about 110°.

Figure 9:
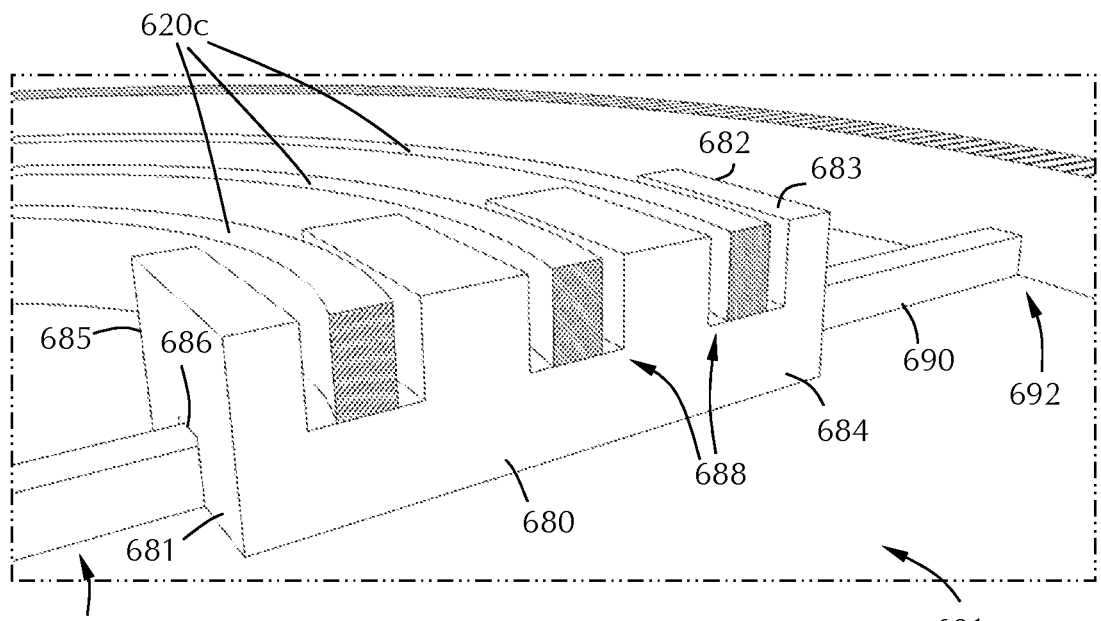
FIG. 9 shows a partial view of a heater assembly in accordance with one or more embodiment of the disclosure.

Referring to FIG. 9, some embodiments of the disclosure include a carriage 680 with an inner end 681, an outer end 682, a top 683, a first side 684 and a second side 685. The carriage 680 includes a plurality of cutouts 688. Each cutout is sized to support a heating element 620. The embodiment shown in FIG. 9 includes three cutouts 688 with each sized to support a coil of the outer heating element 620c.

The carriage 680 can be configured to move along a rail 690 between an inner position 691 and an outer position 692. The inner position 691 is closer to the central axis 602 than the outer position 692 which is closer to the sidewall 607. The carriage 680 moves from the inner position 691 to the outer position 692, and vice versa, as a result of expansion and/or contraction of the heating element supported within the cutouts 688.

The rail 690 in FIG. 9 is shown as a track attached to the surface 603 of the cylindrical body 601. A groove 686 in a bottom of the carriage 680 cooperatively interacts with the rail 690 to ride along the rail 690 during expansion and contraction of the heating element 620. The configuration shown in FIG. 9 is merely representative of one exemplary embodiment. In some embodiments, the carriage 680 has a projection on the bottom that rides within a groove in the surface of the body. Those skilled in the art will understand that there are other arrangements of components that allow a carriage to support a heating element and move with expansion/contraction of same. In some embodiments, each heating element is supported in a carriage. In some embodiments, at least one of the heating elements is in a carriage and at least one of the heating elements is not in a carriage.

The carriage 680 can be made from any suitable material that electrically insulates the heating element from the body. Suitable materials include, but are not limited to, quartz, ceramic (e.g., $Al_2O_3$) and/or ceramic fiber insulated material (e.g., a porous ceramic).

Figure 10:
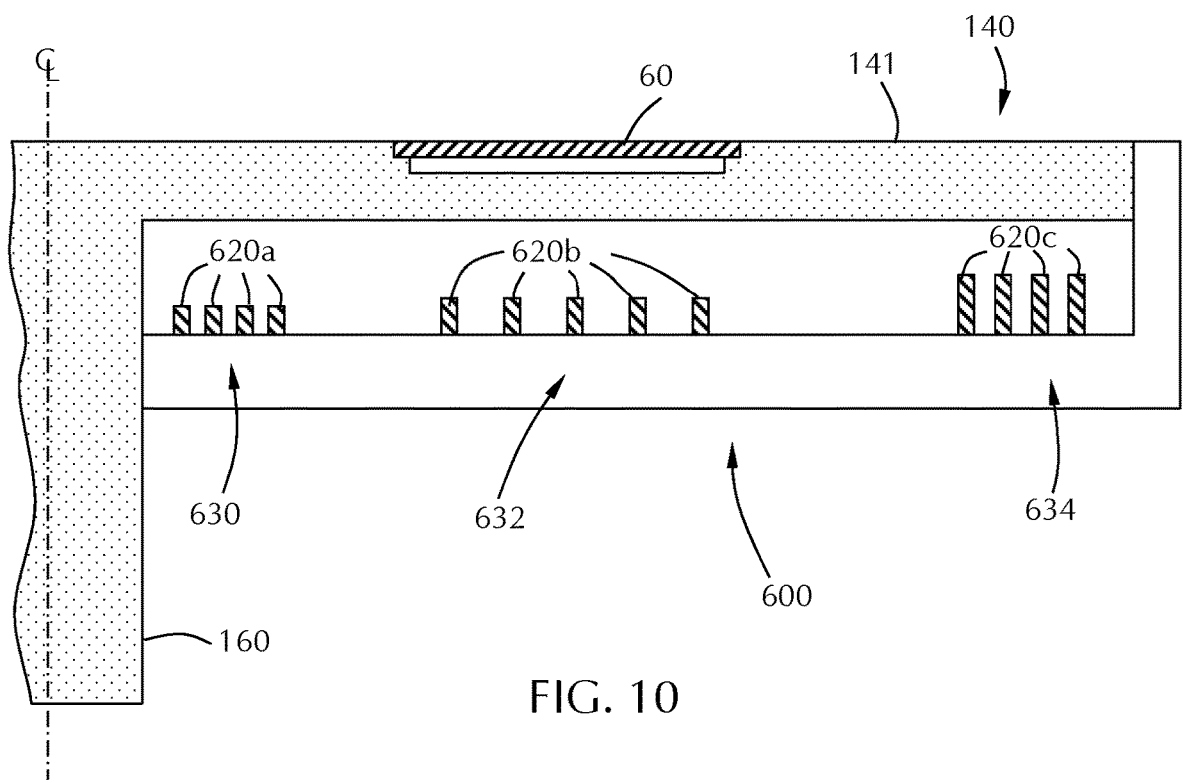
FIG. 10 shows a partial cross-sectional view of a susceptor assembly incorporating a heater assembly in accordance with one or more embodiment of the disclosure.

The heater assembly 600 can remain stationary within the processing chamber while other components of the processing chamber may rotate. For example, in some embodiments, the heater assembly 600 is stationary while the susceptor assembly rotates around axis of the support post 160. In embodiments of this sort, the heater assembly 600 may be positioned adjacent the bottom of the susceptor assembly without being connected to the susceptor assembly. In some embodiments, as shown in FIG. 10, the heater assembly 600 is an integral component of the susceptor assembly 140. In some embodiments, the inner heating element 620a creates a heater buffer region near the inner region of the susceptor assembly 140 near the rotational axis of the support post 160. The rotational axis is the center of rotation for the susceptor assembly and may be determined based on the position of the support post 160 about which the susceptor assembly 140 is rotated. In embodiments of this sort, the heater assembly 600 can rotate with the susceptor assembly, or can be a fixed component that is not connected to the support post 160 so that rotation of the support post does not rotate the heater assembly.

The inner heating element 620a may be positioned adjacent the substrate 60 so that there is some overlap of the substrate 60 and the inner heating element 620a or can be positioned so that there is no vertical overlap between the wafer and the heating element 620a as shown. The middle heating element 620b can be positioned adjacent to or vertically overlapping or aligned with the substrate 60. The outer heating element 620c can overlap the outer edge of the wafer or have little or no vertical overlap with the substrate 60.

Figure 11:
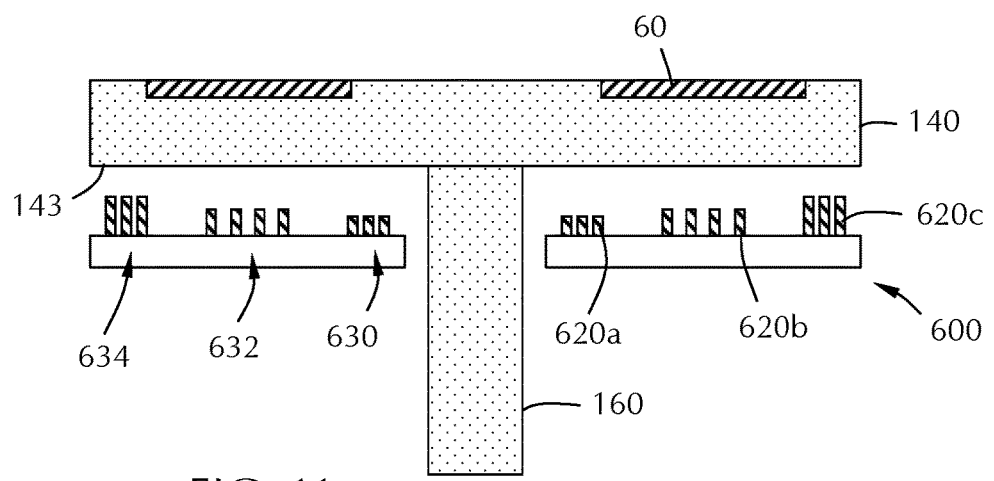
FIG. 11 shows a partial cross-sectional view of a heater assembly adjacent to a susceptor assembly in accordance with one or more embodiment of the disclosure.

In some embodiments, the heater assembly 600 is positioned adjacent to the susceptor assembly 140 but not as an integral component of the assembly. For example, FIG. 11 shows a cross-sectional schematic view of a susceptor assembly 140 with a heater assembly 600 positioned adjacent the bottom surface 143 of the susceptor assembly.

According to one or more embodiments, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional regent. Therefore, any leftover reagent in the chamber may react. With spatial separation, excess reagent does not need to be purged, and cross-contamination is limited. Furthermore, a lot of time can be used to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A heater assembly for a semiconductor processing chamber, the heater assembly comprising:
    a cylindrical body with a central axis and a surface surrounded by a sidewall, a distance between the central axis and the sidewall being sufficient for a batch processing chamber at greater than or equal to 300 mm; and
    a plurality of resistive heating elements radially spaced on the surface of the cylindrical body, each of the plurality of resistive heating elements forming a radially spaced heating zone, the plurality of resistive heating elements forming an inner heating zone a first distance from the central axis, a middle heating zone a second distance from the central axis greater than the first distance and an outer heating zone a third distance from the central axis greater than the second distance, each heating element having a spiral shape with an inner end and an outer end defining a length of the heating element, each coil of the spiral shape spaced from an adjacent coil by a distance sufficient to prevent arcing between adjacent coils,
    wherein the inner heating zone comprises an inner heating element with a first length and a first number of coils, the middle heating zone comprising a middle heating element with a second length a second number of coils and the outer heating zone comprises an outer heating element with a third length and a third number of coils, wherein each of the inner heating element, middle heating element and outer heating element comprise at least three coils,
    wherein the inner heating element is positioned within an inner channel in the surface of the cylindrical body, the inner channel conforming in shape to the inner heating element so that the length of the inner heating element is within the inner channel,
    wherein the middle heating element is positioned within a middle channel in the surface of the cylindrical body, the middle channel conforming in shape to the middle heating element so that the length of the middle heating element is within the middle channel,
    wherein the outer heating element is positioned within an outer channel in the surface of the cylindrical body, the outer channel conforming in shape to the outer heating element so that the length of the outer heating element is within the outer channel, and wherein the outer channel has a depth less than a depth of the middle channel, the middle channel has a depth less than a depth of the inner channel, and the inner heating element has a first width and a first height, the middle heating element has a second width and a second height, and the outer heating element has a third width and a third height, the first width being greater than the second width, the second width being greater than the third width, the first height being less than the second height, and the second height being less than the third height.

2. The heater assembly of claim 1, wherein each of the inner heating element, middle heating element and outer heating element comprise graphite.

3. The heater assembly of claim 1, wherein the inner channel is wider than the inner heating element to allow expansion of the inner heating element.

4. The heater assembly of claim 1, wherein the inner channel has a depth greater than a height of the inner heating element so that walls of the inner channel extend above a top of the inner heating element.

5. The heater assembly of claim 1, wherein the middle channel is wider than the middle heating element to allow expansion of the middle heating element.

6. The heater assembly of claim 1, wherein the middle channel has a depth greater than a height of the middle heating element so that walls of the middle channel extend above a top of the middle heating element.

7. The heater assembly of claim 1, wherein the outer channel is wider than the outer heating element to allow expansion of the outer heating element.

8. The heater assembly of claim 1, wherein the outer channel has a depth that is substantially the same as a height of the outer heating element so that a top of the outer heating element is substantially even with the surface of the cylindrical body.

9. The heater assembly of claim 1, wherein the plurality of spiral resistive heating elements are axially spaced into the surface of the cylindrical body, each of the plurality of resistive heating elements forming an axially spaced heating zone within axially spaced heating channels, wherein the inner heating element in the inner heating channel is lower than the middle heating element in the middle heating channel, and the middle heating element in the middle heating channel is lower than the outer heating element in the outer heating channel.

* * * * *